United States Patent
Li et al.

(10) Patent No.: US 9,136,463 B2
(45) Date of Patent: Sep. 15, 2015

(54) METHOD OF FORMING A MAGNETIC TUNNEL JUNCTION STRUCTURE

(75) Inventors: Xia Li, San Diego, CA (US); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/943,042

(22) Filed: Nov. 20, 2007

(65) Prior Publication Data

US 2009/0130779 A1    May 21, 2009

(51) Int. Cl.
*H01L 21/00* (2006.01)
*H01L 43/12* (2006.01)

(52) U.S. Cl.
CPC ........................... *H01L 43/12* (2013.01)

(58) Field of Classification Search
USPC .............. 257/E21.232, 665, 587; 438/3, 551, 438/671, 77, 147, 736
See application file for complete search history.

(56) References Cited

U.S. PATENT DOCUMENTS

| | | | |
|---|---|---|---|
| 5,835,003 A * | 11/1998 | Nickel et al. ............... | 338/32 R |
| 6,562,634 B2 | 5/2003 | Bronner et al. | |
| 6,573,030 B1 * | 6/2003 | Fairbairn et al. ............. | 430/323 |
| 6,704,220 B2 | 3/2004 | Leuschner | |
| 6,849,465 B2 | 2/2005 | Park et al. | |
| 6,984,585 B2 | 1/2006 | Ying et al. | |
| 6,998,662 B2 * | 2/2006 | Lee ............................... | 257/295 |
| 7,183,120 B2 | 2/2007 | Berg et al. | |
| 2003/0013252 A1 * | 1/2003 | Hwang et al. ................. | 438/255 |
| 2003/0181056 A1 * | 9/2003 | Kumar et al. ................. | 438/710 |
| 2003/0203510 A1 | 10/2003 | Hineman et al. | |
| 2003/0216052 A1 | 11/2003 | Kakamu | |
| 2004/0129361 A1 * | 7/2004 | Chen et al. ...................... | 156/58 |
| 2004/0175934 A1 | 9/2004 | America et al. | |
| 2004/0209476 A1 | 10/2004 | Ying et al. | |
| 2005/0032320 A1 | 2/2005 | Yokoyama | |
| 2005/0048674 A1 * | 3/2005 | Shi et al. ............................ | 438/3 |
| 2005/0127416 A1 | 6/2005 | Han et al. | |
| 2005/0167839 A1 * | 8/2005 | Wetzel et al. ................. | 257/758 |
| 2006/0014305 A1 | 1/2006 | Lee et al. | |
| 2006/0148234 A1 | 7/2006 | Chen et al. | |

FOREIGN PATENT DOCUMENTS

| | | |
|---|---|---|
| CN | 1656580 A | 8/2005 |
| JP | 4021913 A | 1/1992 |
| JP | 6306647 A | 11/1994 |
| JP | 2003273420 A | 9/2003 |
| JP | 2003332337 A | 11/2003 |
| JP | 2004349687 A | 12/2004 |
| JP | 2005072541 A | 3/2005 |

(Continued)

OTHER PUBLICATIONS

International Search Report-PCT/US08/084185, International Search Authority-European Patent Office-Apr. 6, 2009.

(Continued)

*Primary Examiner* — Yasser A Abdelaziez
(74) *Attorney, Agent, or Firm* — Donald D. Min

(57) ABSTRACT

In a particular embodiment, a method is disclosed that includes forming a magnetic tunnel junction (MTJ) structure including a conductive layer on a substrate. The method also includes depositing a sacrificial layer on the conductive layer before depositing a patterning film layer.

21 Claims, 10 Drawing Sheets

(56) References Cited

FOREIGN PATENT DOCUMENTS

| | | |
|---|---|---|
| JP | 2005175493 A | 6/2005 |
| JP | 2005523575 A | 8/2005 |
| JP | 2005524238 A | 8/2005 |
| WO | WO03088253 A1 | 10/2003 |
| WO | WO03094182 A1 | 11/2003 |

OTHER PUBLICATIONS

Written Opinion-PCT/US08/084185, International Search Authority-European Patent Office-Apr. 6, 2009.

* cited by examiner

METHOD OF FORMING A MAGNETIC TUNNEL JUNCTION STRUCTURE

I. FIELD

The present disclosure is generally related to a system and method of forming a magnetic tunnel junction structure.

II. DESCRIPTION OF RELATED ART

In general, a magnetic tunnel junction (MTJ) structure is deposited on a substrate by depositing multiple film layers, including different types of magnetic materials. The MTJ structure includes a reference magnetic layer (i.e., a fixed layer) that is pinned to anti-ferromagnetic film by annealing to have a fixed orientation. The MTJ structure also includes a barrier layer (oxidation layer) to provide a tunneling junction and a free layer that has a magnetic orientation, which can be changed by applying a particular electrical current to the MTJ structure. The MTJ structure typically also integrates metallic conductors, such as Tantalum (Ta), Ruthenium (Ru), Titanium (Ti), other electrically conductive materials, or any combination thereof. Such metallic conductors can be used as a bottom electrode and a top electrode for reading a data bit from or writing a data bit to the MTJ structure.

For advanced technologies, for example, 65 nm and beyond, the MTJ structure is defined by incorporating an advanced patterning film (APF), such as amorphous Carbon (C), for accurate control of dimensions. This APF is applied along with a hard mask and an anti-reflective coating layer for pattern definition. Conventionally, after deposition of the multiple MTJ film layers and a cap film layer, the fabrication process includes depositing an APF layer, a hard mask layer, and anti-reflection layer with photo-resistive material (i.e., an anti-reflection layer can reduce pattern distortion by reducing light reflection in lithography patterning processes) to form a multi-layer MTJ structure. A lithography patterning process (i.e., a photo patterning and etching process) is applied to selectively remove portions of the multi-layer structure. In particular, the lithography process uses light to transfer a pattern definition to a light-sensitive chemical (photo-resist, or simply "resist") layer and through a hard mask and an advanced patterning film layer (i.e., the APF layer) onto the structure. The lithography process also includes exposing the patterned structure to a series of chemical treatments that engrave the pattern definition into the material underneath the photo-resist layer.

Typically, etch rate differences between the film stack of the MTJ structure and the hard mask result in a top electrode film being used as another hard mask for the etching process of the MTJ structure. In particular, during the chemical etching and clean treatments, portions of the top electrode film may be exposed. Such exposed portions of the electrode film are prone to oxidation. Oxidation causes an oxide film (i.e., electrically insulating film layer) to form on the metallic electrode. Additionally, such exposure of portions of the top electrode film can damage the electrode, such as by causing erosion, oxidation, corner rounding (i.e., erosion of the electrode edges, which may expose a sidewall of the MTJ), or any combination thereof. Such damage can impact a contact resistance of the MTJ structure and potentially even expose or damage the MTJ junction. Hence, there is a need for an improved method of forming an MTJ structure.

III. SUMMARY

In a particular embodiment, a method is disclosed that includes forming a magnetic tunnel junction (MTJ) structure including a conductive layer on a substrate. The method also includes depositing a sacrificial layer on the conductive layer before depositing a patterning film layer.

In another particular embodiment, a method is disclosed that includes depositing a first electrode on a substrate and forming a magnetic tunnel junction (MTJ) structure on the first electrode. The MTJ structure includes a tunnel barrier layer sandwiched between two magnetic layers. The method further includes depositing a second electrode on the MTJ structure and depositing a sacrificial cap layer on the second electrode before deposition of an advanced patterning film layer. The sacrificial cap layer is adapted to reduce oxidation and erosion of the second electrode during at least one patterning process.

In still another embodiment, a method is disclosed that includes forming a magnetic tunnel junction (MTJ) structure including a tunnel barrier layer between two magnetic layers. The method further includes depositing a top electrode on the MTJ structure and depositing a sacrificial cap layer onto the top electrode before depositing an advanced patterning film layer onto the top electrode.

One particular advantage provided by embodiments of the disclosed methods of forming a magnetic tunnel junction (MTJ) structure is that a sacrificial cap layer protects a top electrode of the MTJ structure during a photolithography (or photo-etching) process to reduce oxidation, erosion and corner rounding.

Another particular advantage is provided in that a sacrificial layer that is deposited on a top electrode, before applying an advanced patterning film for photo-etching, reduces recesses at a sidewall of the MTJ structure. In a particular example, the sacrificial layer reduces undesired erosion or etching of the top electrode and of the sidewalls of the MTJ structure during a top cap layer etching process that opens a contact window for the top electrode.

Still another particular advantage is provided in that a second top electrode clean and deposit process window is improved, i.e., enlarged, and the overall reliability of MTJ process and resulting MTJ structure is also improved.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 3:
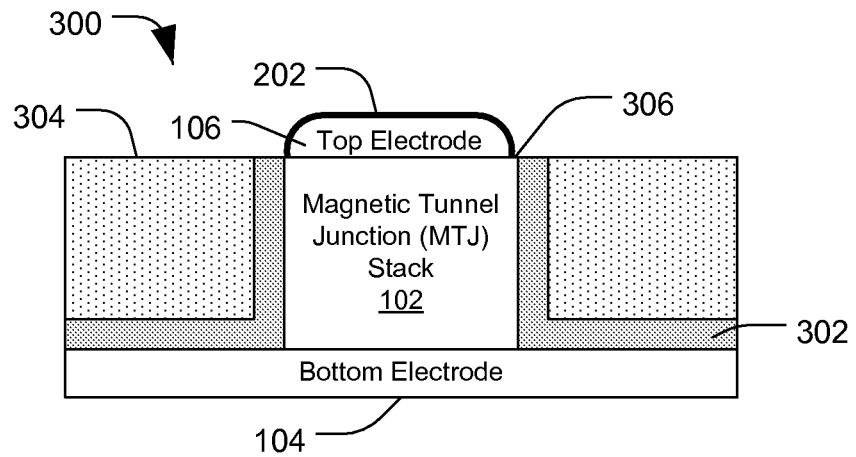
FIG. 3 is a cross-sectional diagram of the representative MTJ structure of FIG. 2 after deposition of a spacer layer, an inter-layer dielectric layer, and Chemical Mechanical Planarization open MTJ contact window.
Figure 4:
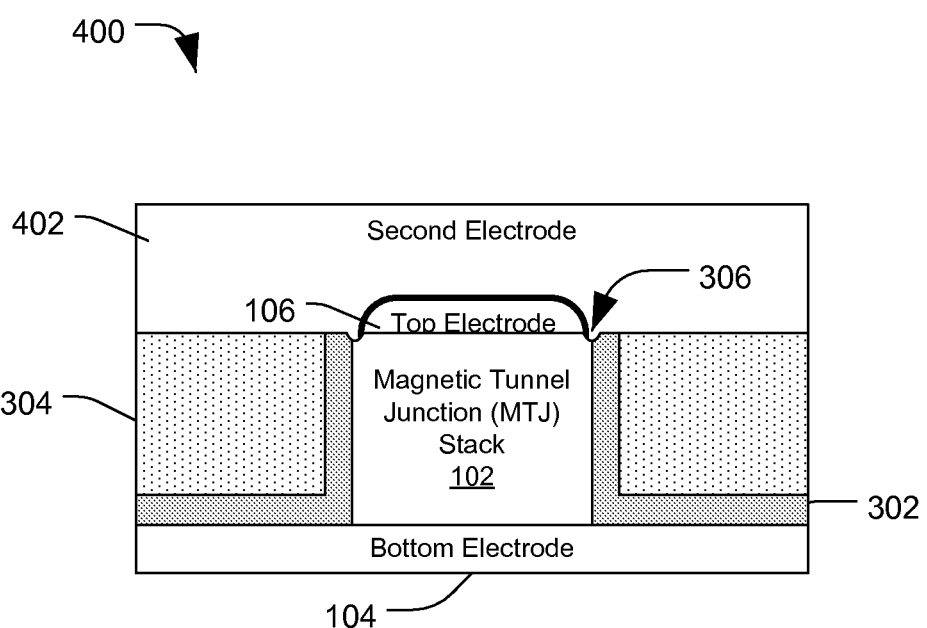
Figure 5:
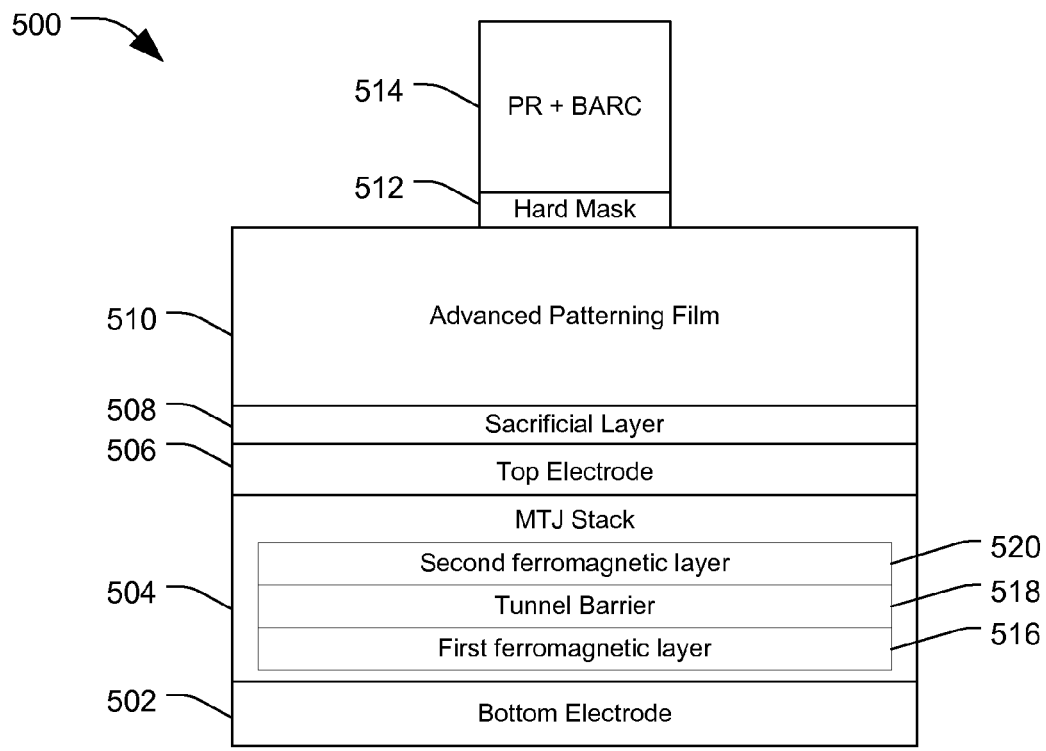
Figure 6:
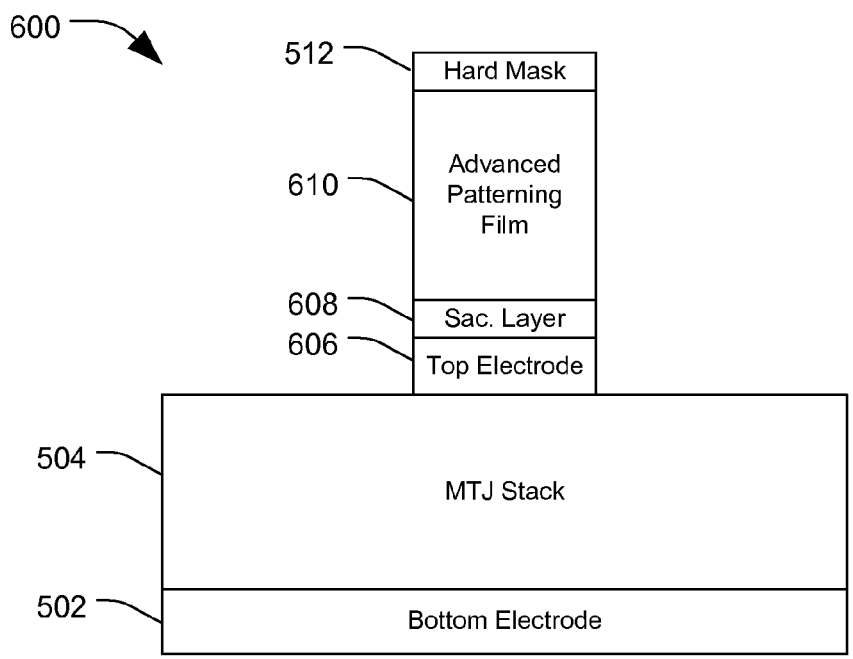
Figure 7:
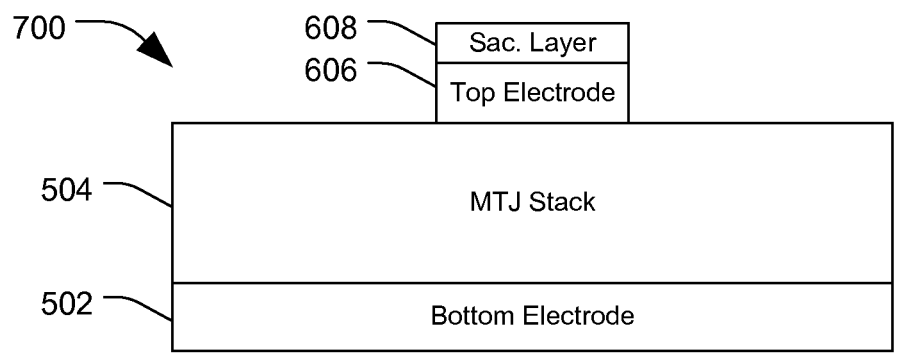
Figure 8:
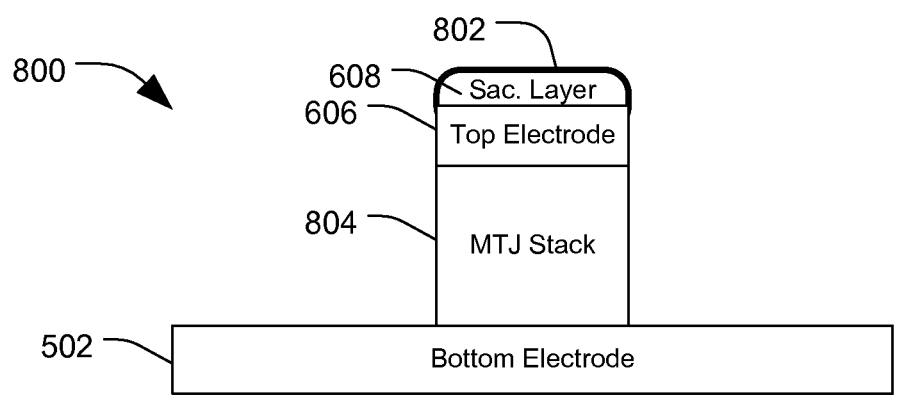
Figure 9:
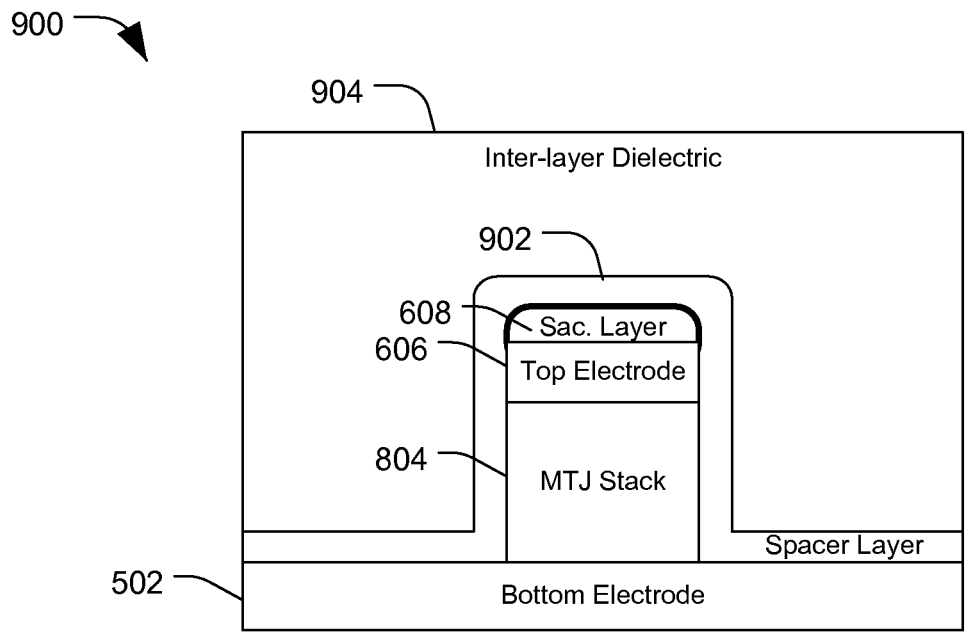
Figure 10:
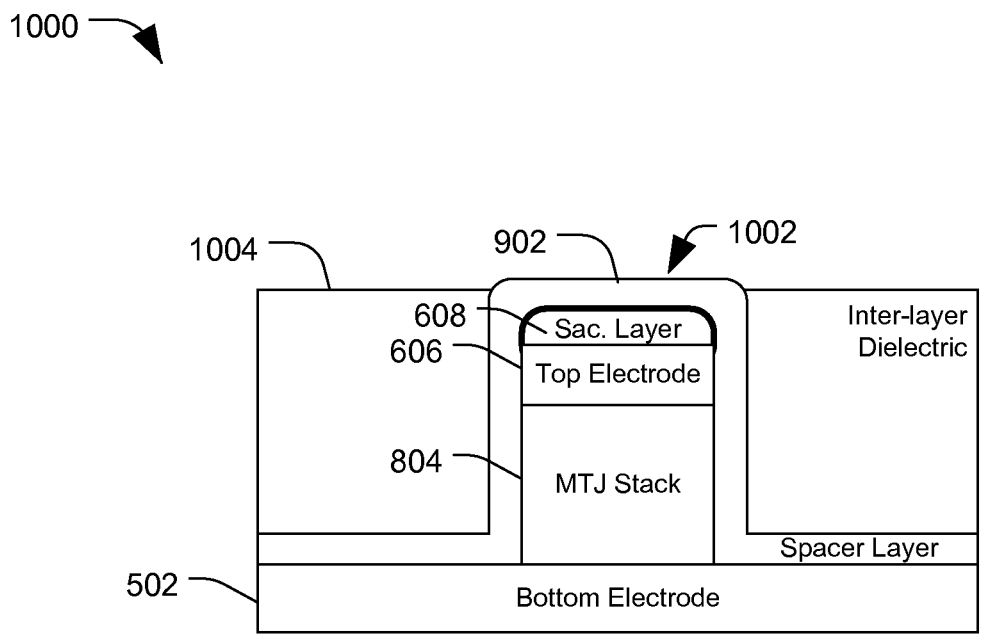
Figure 11:
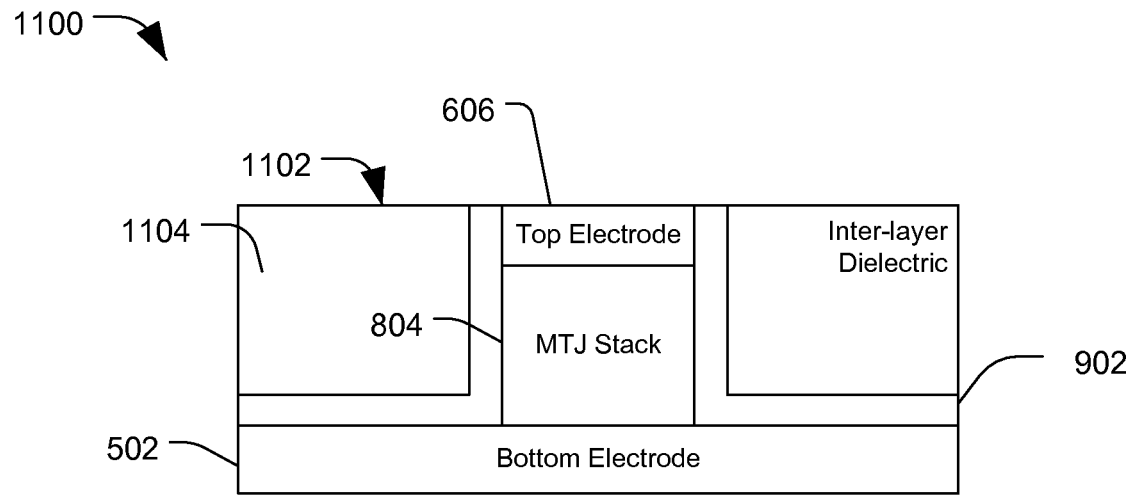
Figure 12:
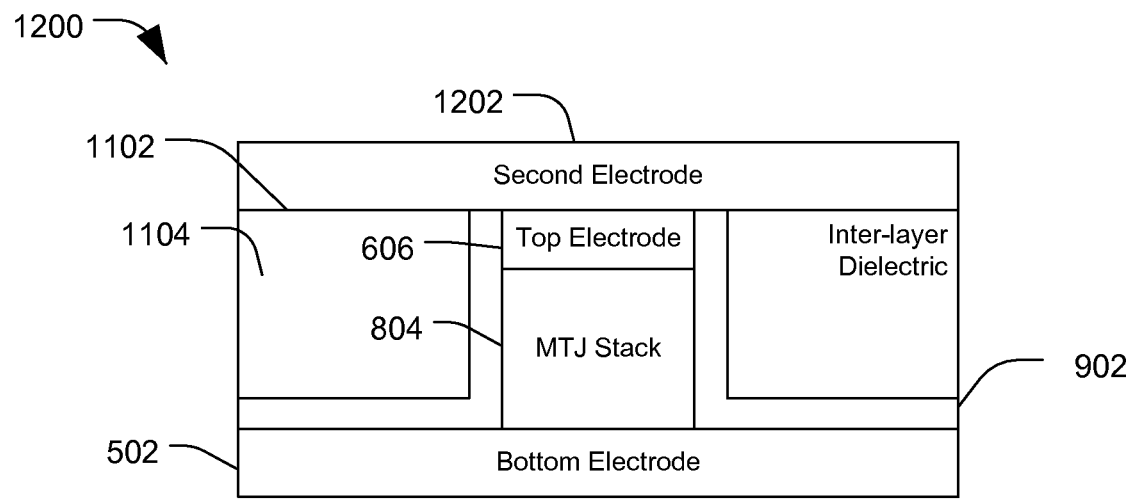
Figure 13:
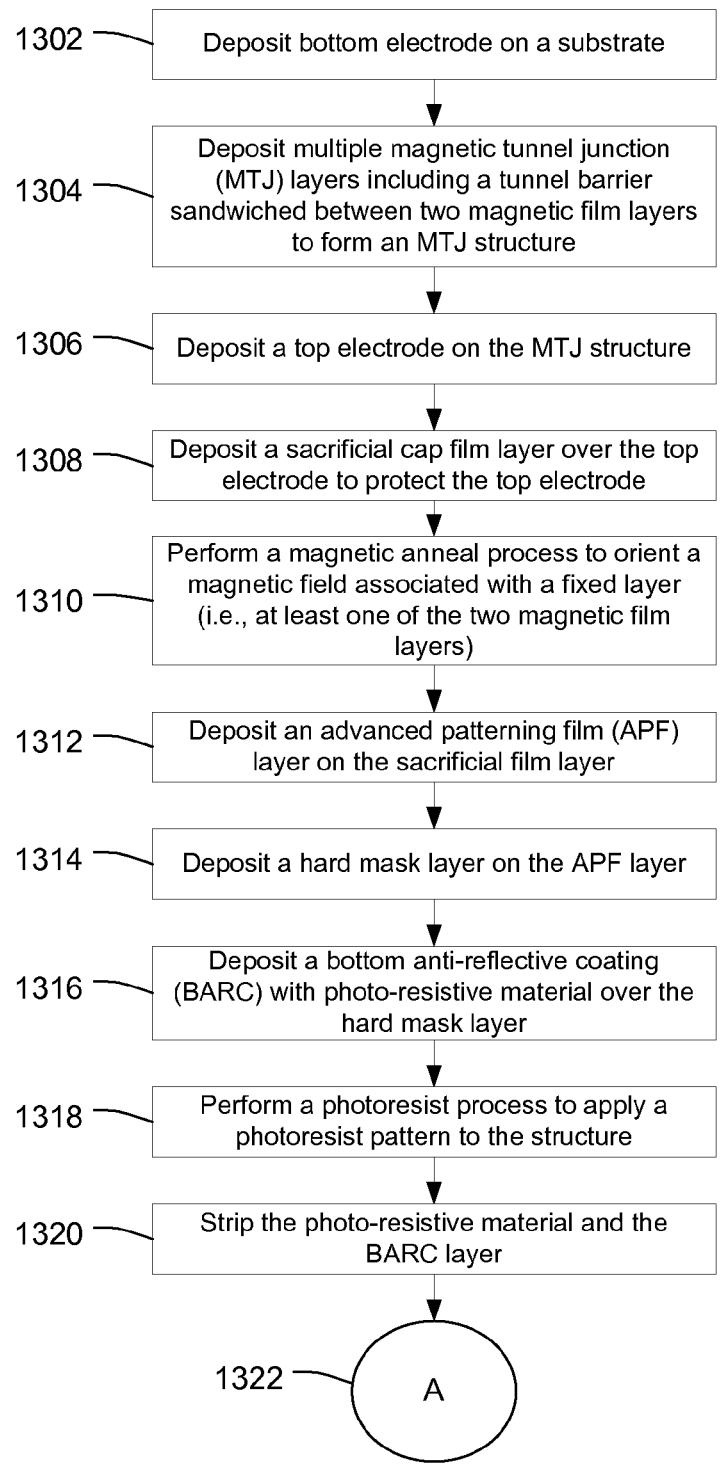
Figure 14:
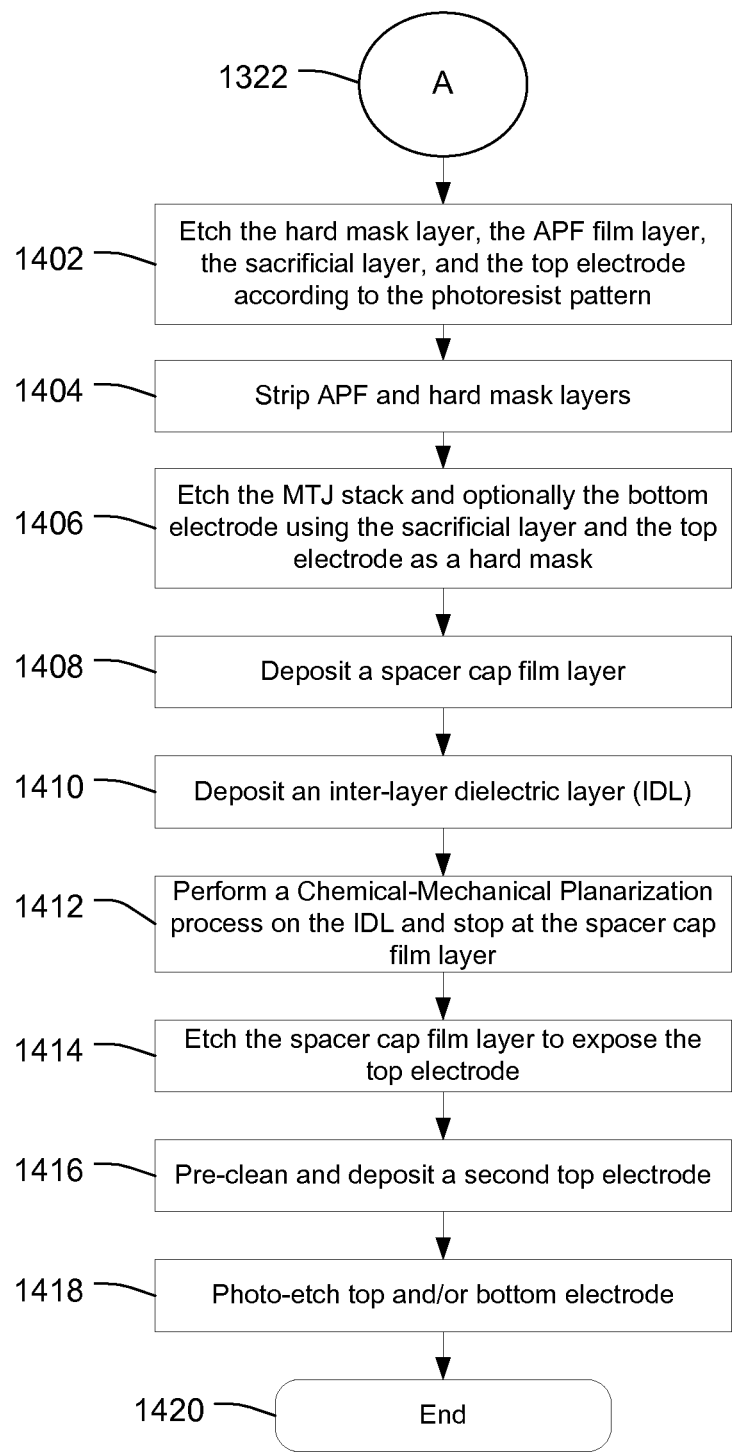
Figure 15:
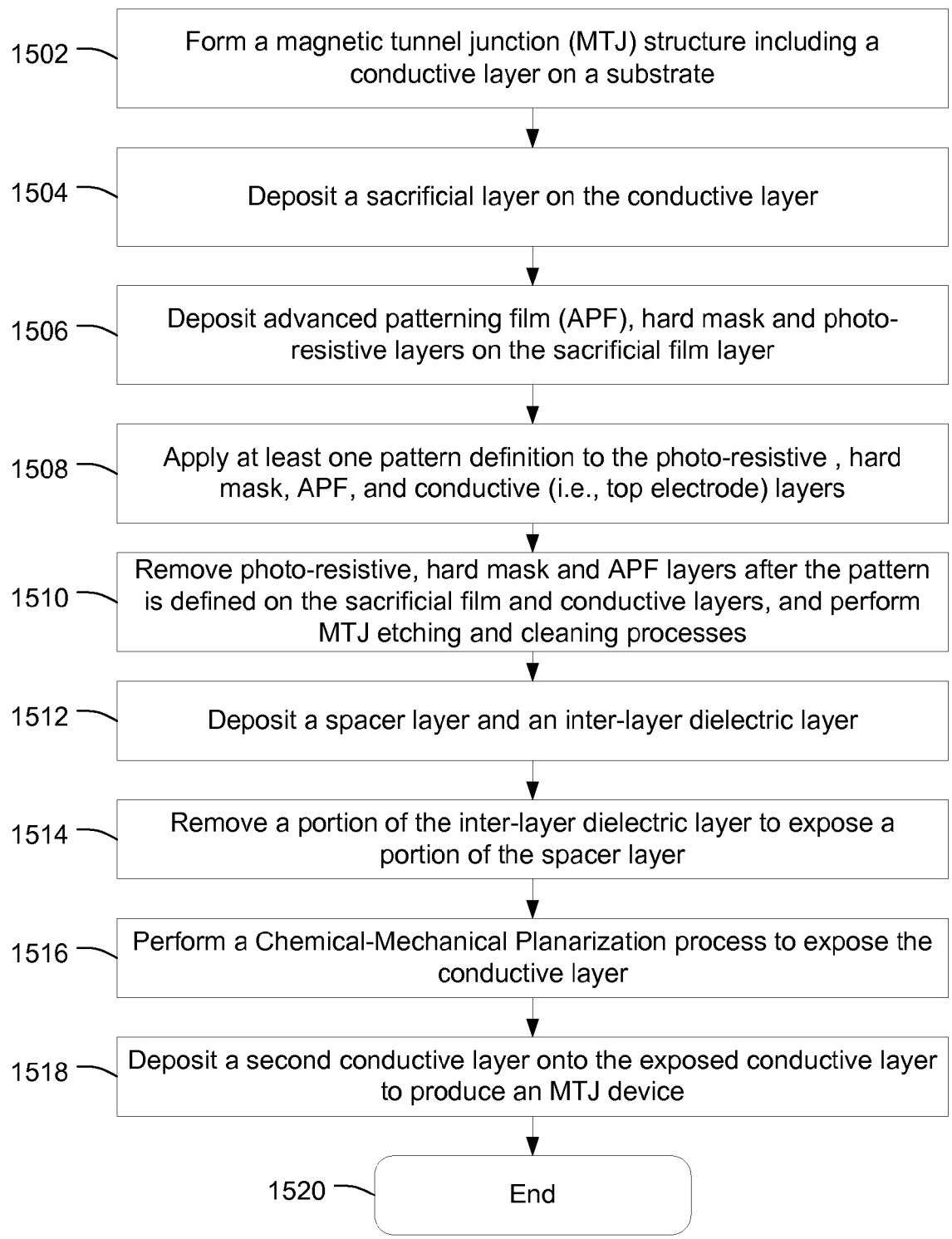
Figure 16:
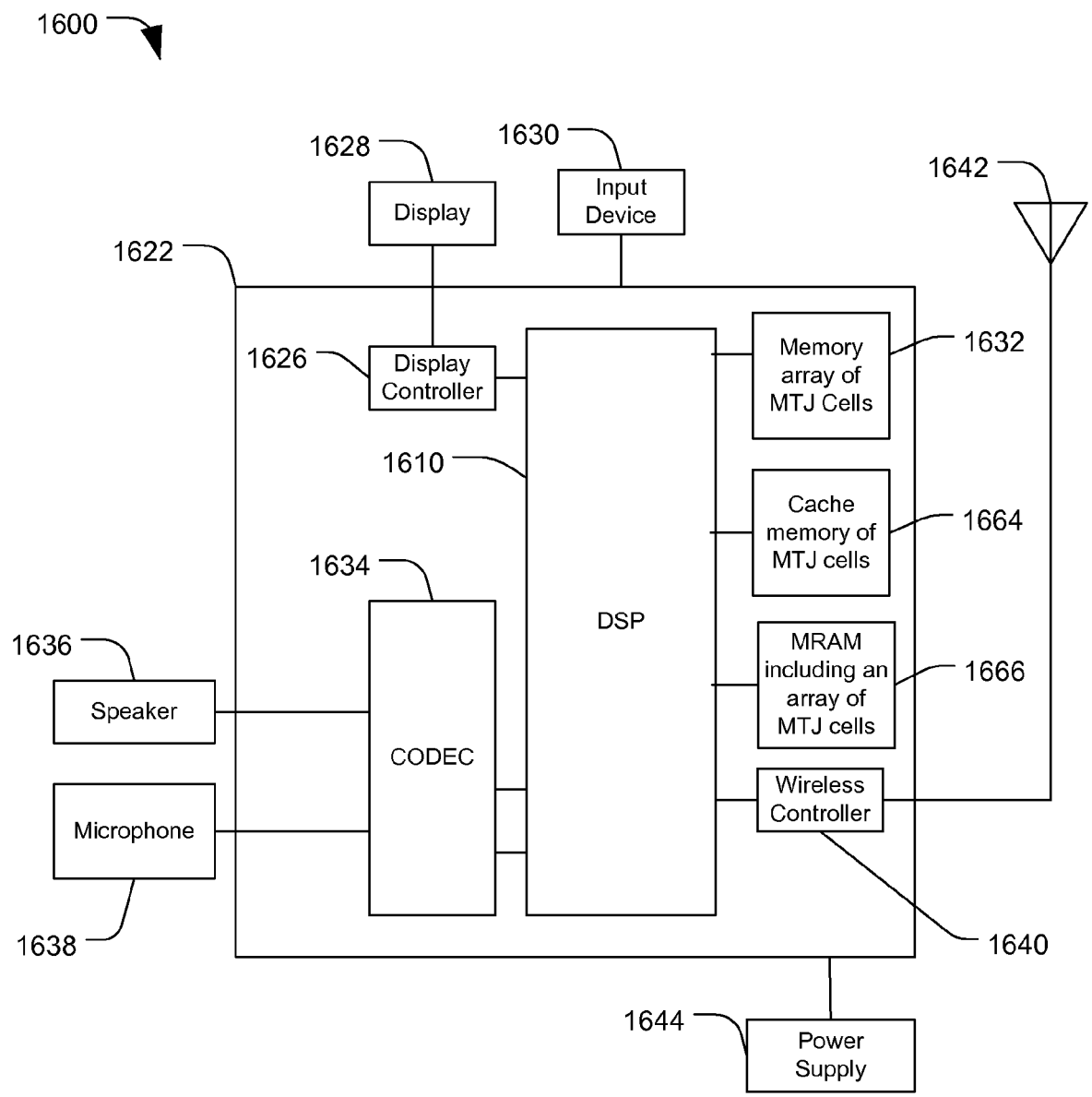

FIG. 4 a cross-sectional diagram of the representative MTJ structure of FIG. 3 after deposition of a second electrode illustrating damage to the MTJ structure;

FIG. 5 is a cross-sectional diagram of a particular illustrative embodiment of a magnetic tunnel junction (MTJ) structure, including a sacrificial layer;

FIG. 6 is a cross-sectional diagram of the MTJ structure of FIG. 5 after patterning and removal of photo-resist and anti-reflective coating layers and removal of portions of an advanced patterning film (APF) layer, a sacrificial layer, and a top electrode;

FIG. 7 is a cross-sectional diagram of the MTJ structure of FIG. 6 after removal of a hard mask layer and the APF layer;

FIG. 8 is a cross-sectional diagram of the MTJ structure of FIG. 7 after applying a pattern definition using the sacrificial layer and the top electrode as a hard mask and after removing portions of an MTJ stack according to the pattern definition;

FIG. 9 is a cross-sectional diagram of the MTJ structure of FIG. 8 after deposition of a spacer layer and an inter-layer dielectric layer;

FIG. 10 is a cross-sectional diagram of the MTJ structure of FIG. 9 after removal of a portion of the inter-layer dielectric layer to expose a portion of the spacer layer;

FIG. 11 is a cross-sectional diagram of the MTJ structure of FIG. 10 after a chemical-mechanical polishing (CMP) process to expose the top electrode at a planar surface of the substrate or after blank etching to remove the spacer layer and the sacrificial layer;

FIG. 12 is a cross-sectional diagram of the MTJ structure of FIG. 11 after deposition of a second electrode to form an MTJ cell;

FIGS. 13 and 14 are flow diagrams illustrating a particular embodiment of a method of forming a magnetic tunnel junction (MTJ) cell on a substrate;

FIG. 15 is a flow diagram of a second particular illustrative embodiment of a method of forming an MTJ cell on a substrate; and FIG. 16 is a block diagram of a representative wireless communications device including a memory device having a plurality of MTJ cells.

V. DETAILED DESCRIPTION

Figure 1:
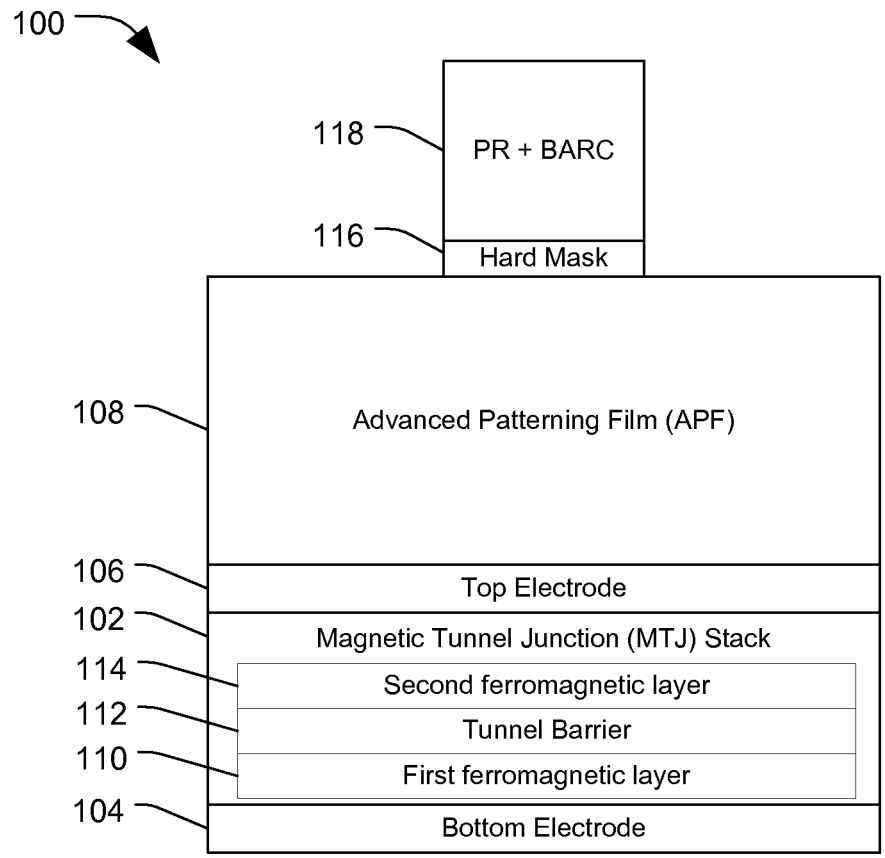
FIG. 1 is a cross-sectional diagram of a particular illustrative embodiment of a conventional arrangement of deposit layers during formation of a representative magnetic tunnel junction (MTJ) structure.

FIG. 1 is a cross-sectional diagram of a particular illustrative embodiment of a conventional arrangement of deposit layers of a representative magnetic tunnel junction (MTJ) structure 102. In general, the MTJ structure 102 includes a bottom electrode 104 and a magnetic tunnel junction (MTJ) stack 102 that is deposited on the bottom electrode 104. The MTJ stack 102 includes multiple layers including a first ferromagnetic layer 110, a tunnel junction or tunnel barrier layer 112, and a second ferromagnetic layer 114, where the tunnel barrier layer 112 is sandwiched between the first and second ferromagnetic layers 110 and 114. The first ferromagnetic layer 110 and the second ferromagnetic layer 114 can be referred to as a reference layer (i.e., a fixed layer) and a free layer, or vice versa. The MTJ structure 102 further includes a top electrode 106 deposited on the MTJ stack 102 and an advanced patterning film (APF) layer 108 deposited on top of the top electrode 106.

In a particular example, a hard mask 116 may be deposited on the APF layer 108 and a bottom anti-reflective coating (BARC) and photo-resist 118 is deposited on top of hard mask 116. A pattern is lithographically defined on the photo-resist 118 and the pattern is transferred to the hard mask 116. The hard mask 116 transfers the pattern to the APF film layer 108. Portions of the APF film layer 108, the top electrode 106, and the MTJ stack 102 may be removed according to the pattern definition to form the MTJ structure 200 of FIG. 2.

Figure 2:
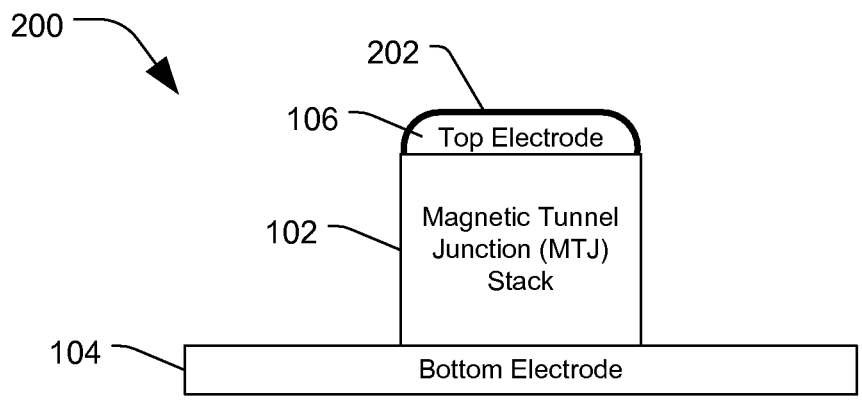
FIG. 2 is a cross-sectional diagram of the representative MTJ structure of FIG. 1 after patterning and removal of excess material illustrating corner rounding of a top electrode layer.

FIG. 2 is a cross-sectional diagram of a patterned MTJ structure 200 that is formed by removal of the APF film layer 108 and removal of portions of top electrode layer 106 and the MTJ stack 102. The MTJ structure 200 includes the bottom electrode 104, a patterned MTJ stack 102, and a top electrode 106. The top electrode 106 exhibits characteristic corner rounding and oxidation 202. The oxidation 202 may introduce an electrically insulative layer on at least a portion of a surface of the top electrode 106. Such oxidation may adversely impact an electrical connection between the top electrode and another electrical conductor.

FIG. 3 is a cross-sectional diagram of a representative MTJ structure 300, which corresponds to the patterned MTJ structure 200 illustrated in FIG. 2, after deposition of a spacer layer 302 and an inter-layer dielectric layer 304, then a Chemical Mechanical Planarization or blank etching is performed to remove a portion of the inter-layer dielectric layer 304 and the spacer layer 302. The MTJ structure 300 includes the bottom electrode 104, the MTJ stack 102 and the top electrode 106. The top electrode 106 exhibits corner rounding and oxidation 202. Additionally, the corner rounding and oxidation 202 have exposed a portion of the MTJ stack, as indicated at 306.

FIG. 4 a cross-sectional diagram of a representative MTJ structure 400 corresponding to the MTJ structure 300 of FIG. 3, after deposition of a second electrode 402. In this example, even when a pre-clean process is performed to remove the oxide 202, the oxide 202 may not be removed completely or the recess at 306 may be increased. The MTJ structure 400 includes the bottom electrode 104, the MTJ stack 102, the top electrode 106, a spacer layer 302, and an inter-layer dielectric layer (IDL) 304. The second electrode 402 is deposited on the top electrode 106, the spacer layer 302, and the IDL 304. The exposed portion 306 of the MTJ stack 102 may reduce a distance between the second electrode 402/top electrode 106 and a tunnel barrier (i.e., the tunnel barrier 112 illustrated in FIG. 1) within the MTJ stack 102. This reduced distance may have an undesired influence on performance of the MTJ structure 400 during operation. In particular, the exposed portion 306 of the MTJ stack 102 may have an undesired impact on contact resistance and may potentially expose or damage the tunnel junction (i.e., the tunnel barrier 112 illustrated in FIG. 1) within the MTJ stack 102.

FIG. 5 is a cross-sectional diagram of a particular illustrative embodiment of a magnetic tunnel junction (MTJ) structure 500 including an arrangement of deposit layers on a substrate. The MTJ structure 500 includes a bottom electrode 502 and an MTJ stack 504 deposited on the bottom electrode 502. The MTJ stack 504 includes multiple layers including a first ferromagnetic layer 516, a tunnel junction or tunnel barrier layer 518, and a second ferromagnetic layer 520, where the tunnel barrier layer 518 is sandwiched between the first and second ferromagnetic layers 516 and 520. The first ferromagnetic layer 516 and the second ferromagnetic layer 520 can be referred to as a reference layer (i.e., a fixed layer) and a free layer, or vice versa. The MTJ structure 500 further includes a top electrode 506, a sacrificial layer 508 deposited on the top electrode 506, an advanced patterning film (APF) 510 deposited on the sacrificial layer 508, a hard mask 512 deposited on the APF 510, and a photo-resist (PR)/bottom anti-reflective coating (BARC) layer 514 deposited on the hard mask 512.

In a particular embodiment, the top electrode 506 and the bottom electrode 502 are deposited from Tantalum (Ta), Titanium (Ti), Ruthenium (Ru), other conductive metals, or any combination thereof. In a particular embodiment, the sacrificial layer 508 can be deposited of Silicon Oxynitride, Silicon Carbon, Silicon Nitride, Titanium Nitride, or any combination thereof.

In a particular embodiment, after deposition of the bottom electrode 502, the MTJ stack 504, and the top electrode 506, the sacrificial layer 508 is deposited on the top electrode 506. The sacrificial layer 508 may be a thin layer of a chemical nature that is similar to a spacer layer or a capping layer and that has little or no impact on an accuracy of a pattern definition applied during a lithographic process. In a particular embodiment, the sacrificial layer 508 is selected to have a photo resolution having a range of approximately 10 angstroms to approximately 5000 angstroms.

A magnetic anneal process may be applied to the MTJ stack 504 to orient a magnetic domain (i.e., to set or orient a direction of a magnetic field) associated with at least one of the ferromagnetic layers, such as the reference layer (fixed layer) 516. The APF 510, the hard mask 512 and the PR/BARC layer 514 are deposited on the sacrificial layer 508. In a particular example, the BARC may be a Silicon Oxynitride. A pattern definition is applied using a lithographic process and a hard mask etch process is performed on the MTJ structure 500 according to the pattern definition and the hard mask 512.

FIG. 6 is a cross-sectional diagram of a patterned MTJ structure 600 that represents the MTJ structure 500 of FIG. 5 after patterning and removal of photo-resist and anti-reflective coating layers 514 and removal of portions of the patterning film 510, the sacrificial layer 508, and the top electrode 512. The MTJ structure 600 includes the bottom electrode 502 and the MTJ stack 504. The MTJ structure 600 also includes a top electrode 606, a sacrificial layer 608, an advanced patterning film (APF) layer 610 and the hard mask 512.

In a particular illustrative embodiment, a second etching process is applied to define a pattern on the APF 610, the sacrificial layer 608, and the top electrode 606. The hard mask 512 and the APF 610 are stripped, leaving the sacrificial layer 608 and the top electrode 606 as a hard mask, as illustrated in FIG. 7.

FIG. 7 is a cross-sectional diagram of a magnetic tunnel junction (MTJ) structure 700 that represents the MTJ structure 600 of FIG. 6 after removal of the hard mask layer 512 and the advanced patterning film (APF) 610. The MTJ structure 700 includes the bottom electrode 502, the MTJ stack 504, the top electrode 606 and the sacrificial layer 608. The sacrificial layer 608 and the top electrode 606 serve as a hard mask during a third MTJ etching process to transfer pattern definition on the MTJ stack 504 and optionally to the bottom electrode 502. Portions of the MTJ stack 504 and optionally the bottom electrode 502 may be removed according to the pattern definition, resulting in patterned MTJ structure as illustrated in FIG. 8.

FIG. 8 is a cross-sectional diagram of a patterned magnetic tunnel junction (MTJ) structure 800 that represents the MTJ structure 700 of FIG. 7 after applying a pattern definition using the sacrificial layer 608 and the top electrode 606 as a hard mask and after removing portions of the MTJ stack 504, according to the pattern definition. In a particular embodiment, application of the pattern definition may also result in removal of a portion of the bottom electrode 502. The MTJ structure 800 includes the sacrificial layer 608, and top electrode 606, an MTJ stack 804, and the bottom electrode 502. The MTJ stack 804 represents a patterned version of the MTJ stack 504 illustrated in FIGS. 5-7. During the MTJ etching process, in a particular embodiment, a portion of the patterned sacrificial cap layer 608 may be lost, resulting in corner rounding and/or oxidation 802 of the sacrificial layer 608, but not the top electrode 606.

FIG. 9 is a cross-sectional diagram of a magnetic tunnel junction (MTJ) structure 900 representing the MTJ structure 800 of FIG. 8 after deposition of a spacer layer 902 and an inter-layer dielectric layer 904. The MTJ structure 900 includes the bottom electrode 502, the MTJ stack 804, the top electrode 606, the sacrificial layer 608, the spacer layer (spacer cap film layer) 902 and the inter-layer dielectric layer 904. In a particular example, the spacer layer 902 and the sacrificial layer 608 may be formed from the same material, such as Silicon Oxynitride, Silicon Carbon, Silicon Nitride, Titanium Nitride, or any combination thereof. The inter-layer dielectric layer 904 is a dielectric film. In a particular embodiment, the inter-layer dielectric layer 904 can include any suitable dielectric material conventionally employed in the manufacture of semiconductor devices, including materials having a dielectric constant of about 3.9 or less (i.e., low-k dielectric layers) to insulate one conductive layer from another. In a particular embodiment, the inter-layer dielectric material 904 is deposited from Silicon Dioxide. The formation of such dielectric layers or films is common in the semiconductor industry and the deposition procedures are familiar to those in the art. In a particular embodiment, the spacer layer 902 and the inter-layer dielectric 904 are deposited to protect the MTJ stack 804, and, in particular, to protect the sidewalls of the MTJ stack 804.

FIG. 10 is a cross-sectional diagram of a magnetic tunnel junction (MTJ) structure 1000 that represents the MTJ structure 900 of FIG. 9 after removal of a portion of the inter-layer dielectric layer 904 to expose a portion 1002 of the spacer layer 902. In particular, a chemical-mechanical polishing (CMP) process is applied to the MTJ structure 900 illustrated in FIG. 9, to remove portions of the inter-layer dielectric layer 904 to define a processed inter-layer dielectric layer 1004. The CMP process is stopped at the spacer layer 902 after a top portion 1002 of the spacer layer 902 is exposed.

FIG. 11 is a cross-sectional diagram of a magnetic tunnel junction (MTJ) structure 1100 that represents the MTJ structure 1000 of FIG. 10 after a Chemical-Mechanical Planarization (CMP) process is applied and etching is performed to expose the top electrode 606 or after blank etching to expose the top electrode 606 at a planar surface 1102 of the substrate. The MTJ structure 1100 includes the bottom electrode 502, the spacer layer 902, the MTJ stack 804, the inter-layer dielectric layer 1104, and the top electrode 606. The top electrode 606 is exposed at the planar surface 1102 of the inter-layer dielectric layer 1104, which is substantially even with the spacer layer 902 to define the planar surface 1102.

FIG. 12 is a cross-sectional diagram of a MTJ structure 1200 that represents the MTJ structure 1100 of FIG. 11 after a cleaning process is performed and after deposition of a second top electrode 1202 to form an MTJ cell. The MTJ structure 1200 includes the bottom electrode 502, the spacer layer 902, the MTJ stack 804, the top electrode 606, the inter-layer dielectric layer 1104, and the second top electrode 1202, which is deposited on the planar surface 1102. In general, the planar surface 1102 (of the MTJ structure 1100 illustrated in FIG. 11) is cleaned and the second top electrode 1202 is deposited on the planar surface 1102 to form an MTJ cell, which is configured to store a data value. In a particular embodiment, another photo and etch process may be applied to etch the top electrode 1202, the bottom electrode 502, or any combination thereof to complete the MTJ cell.

The second top electrode 1202 and the bottom electrode 502 may be coupled to independent wire traces or other electrical interconnections to provide access to the MTJ cell to read and/or write a data bit to a magnetic domain carried by a free magnetic layer within the MTJ stack 804. More particularly, a read/write current may be used to detect/alter a direction of a magnetic field of the free layer, where the direction of the magnetic field represents a digital value. In a particular embodiment, the MTJ structure 1200 can be used as part of a larger circuit device to implement to a logic process, to store data, or any combination thereof.

In a particular embodiment, the process of forming an MTJ cell as described with respect to FIGS. 5-12 produces an MTJ device with improved reliability over conventional MTJ structures. The sacrificial layer 508 illustrated in FIG. 5 and the sacrificial layer 608 illustrated in FIGS. 6-10 reduce or eliminate erosion, oxidation, and corner rounding of the top electrode 606, improving electrical contact resistance and overall integrity of MTJ cell. Additionally, by using the sacrificial layer 508 and 608, for example, a risk of exposing a sidewall of the MTJ structure during an etching process is reduced. In a particular example, the sacrificial film layers 508 and 608 can be selected to have a chemical nature similar to the spacer film 902 or to other capping layers, which do not interfere with the performance of the MTJ device 1200. In a particular embodiment, a chemical structure of the sacrificial layer 508 and 608 is selected so that the sacrificial layer can be thin relative to a thickness of the top electrode 606 while still providing sufficient protection to prevent corner rounding of the top electrode. Additionally, the sacrificial layer 508 and 608 can be selected to have a chemical structure that has little or no impact on a resolution of the pattern definition with respect to the APF layer 510 and 610 illustrated in FIGS. 5 and 6, to allow for an accurate transfer of the pattern definition to define the top electrode 606. In a particular embodiment, the sacrificial layer thickness is selected to have a photo resolution having a range of approximately 10 angstroms to approximately 5000 angstroms.

FIGS. 13 and 14 are flow diagrams illustrating a particular embodiment of a method of forming a magnetic tunnel junction (MTJ) cell on a substrate. At 1302, a bottom electrode is deposited on a substrate. The bottom electrode may be deposited from Titanium (Ti), Ruthenium (Ru), Tantalum (Ta), another electrically conductive material, or any combination thereof. Moving to 1304, multiple magnetic tunnel junction (MTJ) layers are deposited, including a tunnel barrier sandwiched between two magnetic film layers to form an MTJ structure. Typically, the two magnetic film layers are deposited from a ferromagnetic material and the tunnel barrier (i.e., tunnel junction layer) is deposited/oxidized from a target material. Continuing to 1306, a top electrode is deposited on the MTJ structure. Proceeding to 1308, a sacrificial cap film layer is deposited over the top electrode to protect the top electrode. Advancing to 1310, a magnetic anneal process is performed to orient a magnetic field associated with a fixed layer (i.e., at least one of the two magnetic film layers).

Moving to 1312, an advanced patterning film (APF) layer is deposited over the sacrificial film layer. The APF film layer may be selected from a large number of photo-resistive materials to receive a pattern definition. Continuing to 1314, a hard mask layer is deposited on the APF film layer. At 1316, a bottom anti-reflective coating (BARC) with photo-resistive (PR) material layer is deposited over the hard mask layer. An example of a resulting structure is illustrated at FIG. 5. Continuing to 1318, a photo-resist process is performed to apply a photo-resist pattern definition to the structure. Proceeding to 1320, the photo-resistive material and the BARC layer are stripped, and the method advances to 1322, which is continued at FIG. 14.

Referring to FIG. 14, at 1322, the method advances to 1402 and the hard mask, the APF film layer, and the sacrificial layer, and the top electrode are etched according to the photo-resist pattern definition (see, e.g., FIG. 6). Moving to 1404, the APF and hard mask layers are stripped (see, e.g., FIG. 7). Continuing to 1406, the MTJ stack and optionally the bottom electrode are etched using the sacrificial layer and the top electrode as a hard mask (see, e.g., FIG. 8). Proceeding to 1408, a spacer cap film layer is deposited over the structure, which includes the sacrificial layer. Advancing to 1410, an inter-layer dielectric layer (IDL) is deposited. An example of a structure resulting from 1408 and 1410 is shown at FIG. 9.

Continuing to 1412, a Chemical-Mechanical Planarization (CMP) process is performed on the inter-layer dielectric (IDL), stopping at the spacer cap film layer (e.g., FIG. 10). Moving to 1414, the spacer cap film layer is etched to expose the top electrode (e.g., FIG. 11). Proceeding to 1416, the structure is pre-cleaned and a second top electrode is deposited over the top electrode (e.g., FIG. 12). Continuing to 1418, a photo-etch process is performed on the top electrode, the bottom electrode, or any combination thereof. The method terminates at 1420.

FIG. 15 is a flow diagram of a second particular illustrative embodiment of a method of forming an MTJ cell on a substrate. At 1502, a magnetic tunnel junction (MTJ) structure is deposited on a substrate, where the MTJ structure includes a conductive layer (e.g., a bottom electrode). The MTJ structure includes a tunnel junction sandwiched between two magnetic layers. In a particular embodiment, an anneal process may be performed on the MTJ structure to define a magnetic orientation of at least one of the magnetic layers (i.e., a fixed magnetic layer) of the MTJ structure to form a MTJ device. A top electrode layer may be deposited on the MTJ structure. Advancing to 1504, a sacrificial layer is deposited on the top conductive layer (i.e., a top electrode) before depositing advanced patterning film (APF), hard mask, and photo-resist film layers. In a particular embodiment, sacrificial layer is an electrically insulating material, such as Silicon Oxynitride, Silicon Carbon, Silicon Nitride, or Titanium Nitride. In a particular embodiment, the sacrificial layer thickness is selected to have a photo resolution having a range of approximately 10 angstroms to approximately 5000 angstroms.

Moving to 1506, advanced patterning film (APF), hard mask, and photo-resistive layers are deposited on the sacrificial film layer. Continuing to 1508, at least one pattern definition is applied to the photo-resist, hard mask, APF, sacrificial, and top electrode layers. Proceeding to 1510, photo-resist, hard mask, and APF materials are removed according to the at least one pattern definition and an MTJ etching process is performed. In a particular embodiment, a photo-resist/bottom anti-reflective coating (BARC) defines a pattern and transfers the pattern to the hard mask through etching. The photo-resist/BARC and hard mask transfer a pattern to the APF, sacrificial, and top electrode layers. The hard mask and APF layers are stripped, and an MTJ etching process is performed.

Moving to 1512, a spacer layer and an inter-layer dielectric layer are deposited. In a particular embodiment, the spacer layer includes a non-magnetic film material. In a particular example, the sacrificial layer may be deposited from the same material as the spacer layer. Continuing to 1514, a portion of the inter-layer dielectric layer is removed to expose a portion of the spacer layer. Proceeding to 1516, a Chemical-Mechanical Planarization (CMP) process is performed to expose the conductive layer. In a particular embodiment, the exposed conductive layer and the second conductive layer are electrically conductive materials, such as Tantalum (Ta), Titanium (Ti), Ruthenium (Ru), other conductive metals, or any combination thereof. In a particular example, the CMP process can remove the sacrificial layer. Advancing to 1518, a second conductive layer is deposited onto the exposed conductive layer to produce an MTJ device. In a particular example, the second conductive layer is deposited after the sacrificial layer is removed. The method terminates at 1520.

In a particular embodiment, a magnetic tunnel junction (MTJ) structure may be deposited on a first electrode (i.e., a bottom electrode), where the MTJ structure includes a tunnel barrier layer sandwiched between two magnetic material layers. A second electrode (i.e., a top electrode) is deposited on the MTJ structure, and a sacrificial cap layer is deposited on the second electrode before deposition of advanced patterning film (APF), hard mask, and photo-resist/bottom anti-reflective coating (BARC) layers. In a particular example, the sacrificial cap layer is adapted to reduce oxidation and erosion of the second electrode during at least one patterning process. Additionally, a magnetic anneal process may be applied to the structure before deposition of the APF, hard mask, and photo-resist/BARC film layers. The magnetic anneal process is setup orient a magnetic field associated with at least one of the two magnetic film layers.

In a particular embodiment, an APF film layer is deposited on the sacrificial cap layer. A hard mask layer is deposited on the APF film layer. An anti-reflective layer including photo-resistive material is deposited on the hard mask layer. A pattern definition process is performed to define a pattern onto the photo-resist, the anti-reflective layer, and the hard mask layer via a hard mask etching process. The photo-resist/BARC is stripped. The hard mask transfers the pattern to the APF, sacrificial, and the second electrode by a second etching process. The hard mask and the APF are stripped. Finally, an MTJ etching process is performed to transfer the pattern to MTJ stack.

In a particular embodiment, a spacer layer is deposited over the MTJ structure, an inter-layer dielectric layer is deposited over the spacer layer, and portions of the inter-layer dielectric layer are selectively removed to a level that exposes a portion of the spacer layer. A chemical-mechanical Planarization (CMP) process can be performed to selectively remove portions of the inter-layer dielectric layer, the spacer layer, and the sacrificial layer to expose the second electrode at a planar surface. The second conductive layer is deposited onto the planar surface, where the second conductive layer is physically and electrically coupled to the second conductor.

One particular advantage provided by embodiments of the disclosed methods of forming a magnetic tunnel junction (MTJ) structure is that a sacrificial cap layer protects a top electrode of the MTJ structure during a lithography and etching (or photo-etching) process to reduce oxidation, erosion and corner rounding. Another particular advantage is provided in that a sacrificial layer that is deposited on a top electrode, before applying an advanced patterning film for photo-etching, reduces recesses at a sidewall of the MTJ structure. In a particular example, the sacrificial layer reduces undesired erosion or etching of the top electrode and of the sidewalls of the MTJ structure during a top cap layer etching process that opens a contact window for the top electrode. Still another particular advantage is provided in that a second top electrode clean and deposit process window is improved, i.e., enlarged, and the overall reliability of MTJ process and resulting MTJ structure is also improved.

FIG. 16 is a block diagram of a representative wireless communications device including a memory device having a plurality of MTJ cells. FIG. 16 is a block diagram of an illustrative embodiment of a communications device 1600 including a memory array of MTJ cells 1632 and a magneto-resistive random access memory (MRAM) including an array of MTJ cells 1666, which are coupled to a processor, such as a digital signal processor (DSP) 1610. The communications device 1600 also includes a cache memory device of MTJ cells 1664 that is coupled to the DSP 1610. The cache memory device of MTJ cells 1664, the memory array of MTJ cells 1632 and the MRAM device including multiple MTJ cells 1666 may include MTJ cells formed according to a process, as described with respect to FIGS. 5-15.

FIG. 16 also shows a display controller 1626 that is coupled to the digital signal processor 1610 and to a display 1628. A coder/decoder (CODEC) 1634 can also be coupled to the digital signal processor 1610. A speaker 1636 and a microphone 1638 can be coupled to the CODEC 1634.

FIG. 16 also indicates that a wireless controller 1640 can be coupled to the digital signal processor 1610 and to a wireless antenna 1642. In a particular embodiment, an input device 1630 and a power supply 1644 are coupled to the on-chip system 1622. Moreover, in a particular embodiment, as illustrated in FIG. 16, the display 1628, the input device 1630, the speaker 1636, the microphone 1638, the wireless antenna 1642, and the power supply 1644 are external to the on-chip system 1622. However, each can be coupled to a component of the on-chip system 1622, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   forming a magnetic tunnel junction (MTJ) structure including a conductive layer on a substrate;
   depositing a sacrificial layer on the conductive layer, the sacrificial layer comprising silicon carbon;
   depositing an amorphous carbon layer on the sacrificial layer, the sacrificial layer selected to have a chemical structure having substantially no impact on a resolution of a pattern definition with respect to the amorphous carbon layer;
   depositing one or more hard mask and photo-resist layers on the amorphous carbon layer deposited on the sacrificial layer, the amorphous carbon layer located between the sacrificial layer and the one or more hard mask and photo-resist layers;
   patterning and removing the one or more hard mask and photo-resist layers and the amorphous carbon layer; and
   depositing a non-magnetic spacer film on an exposed portion of the sacrificial layer, wherein the sacrificial layer is comprised of the same material as the non-magnetic spacer film.

2. The method of claim 1, further comprising applying at least one pattern definition to the one or more hard mask and photo-resist layers and to the amorphous carbon layer.

3. The method of claim 2, further comprising removing the one or more hard mask and photo-resist layers and the amorphous carbon layer according to the at least one pattern definition.

4. The method of claim 2, further comprising patterning and removing the sacrificial layer.

5. The method of claim 4, further comprising depositing a second conductive layer on the conductive layer after the sacrificial layer is removed.

6. The method of claim 1, wherein the conductive layer comprises titanium (Ti), ruthenium (Ru), or a combination thereof.

7. The method of claim 1, wherein a thickness of the sacrificial layer is selected to have a photo resolution having a range of approximately 10 angstroms to approximately 5000 angstroms.

8. The method of claim 1, further comprising annealing the MTJ structure to define a magnetic orientation of a fixed layer of the MTJ structure to form a MTJ device.

9. A method comprising:
depositing a first electrode on a substrate;
forming a magnetic tunnel junction (MTJ) structure on the first electrode, the MTJ structure including a tunnel barrier layer between two magnetic layers;
depositing a second electrode on the MTJ structure;
depositing a sacrificial cap layer on the second electrode before deposition of an amorphous carbon layer, the sacrificial cap layer to reduce oxidation and erosion of the second electrode during at least one patterning process, the sacrificial cap layer comprising silicon carbon;
depositing the amorphous carbon layer on the sacrificial cap layer, the sacrificial cap layer selected to have a chemical structure having substantially no impact on a resolution of a pattern definition with respect to the amorphous carbon layer;
depositing a hard mask layer and a photo-resist layer on the amorphous carbon layer, the amorphous carbon layer located between the sacrificial cap layer and the hard mask layer;
patterning and removing the hard mask layer, the photo-resist layer, and the amorphous carbon layer; and
depositing a non-magnetic spacer layer over an exposed portion of the sacrificial cap layer, wherein the sacrificial cap layer is comprised of the same material as the non-magnetic spacer layer.

10. The method of claim 9, further comprising performing a magnetic anneal process on the MTJ structure to orient a magnetic field associated with at least one of the two magnetic layers.

11. The method of claim 10, wherein the photo-resist layer comprises an anti-reflective layer.

12. The method of claim 9, further comprising:
performing a pattern definition process to define at least one pattern onto the photo-resist layer prior to removing the photo-resist layer, the hard mask layer, and the amorphous carbon layer;
selectively removing portions of the photo-resist layer, the hard mask layer, the amorphous carbon layer, the sacrificial cap layer, and the second electrode according to the at least one pattern to expose the portion of the sacrificial layer; and
removing the photo-resist layer, the hard mask layer, and the amorphous carbon layer.

13. The method of claim 12, further comprising:
after depositing the non-magnetic spacer layer, depositing an inter-layer dielectric layer over the non-magnetic spacer layer;
selectively removing a portion of the inter-layer dielectric layer to a level that exposes a portion of the non-magnetic spacer layer; and
performing a Chemical-Mechanical Planarization (CMP) process to selectively remove portions of the inter-layer dielectric layer, the non-magnetic spacer layer, and the sacrificial cap layer to expose the second electrode at a substantially planar surface.

14. The method of claim 13, further comprising depositing a conductive layer onto the substantially planar surface of the second electrode, wherein the conductive layer is coupled to the second electrode.

15. A method comprising:
forming a magnetic tunnel junction (MTJ) structure including a tunnel barrier layer between two magnetic layers;
depositing a top electrode on the MTJ structure;
depositing a sacrificial cap layer onto the top electrode before depositing an amorphous carbon layer onto the top electrode, the sacrificial cap layer comprising silicon carbon;
depositing the amorphous carbon layer on the sacrificial cap layer, wherein the sacrificial cap layer is selected to have a chemical structure having substantially no impact on a resolution of a pattern definition with respect to the amorphous carbon layer;
depositing a hard mask layer and a photo-resist layer on the amorphous carbon layer, wherein the amorphous carbon layer is located between the sacrificial cap layer and the hard mask layer;
patterning and removing the hard mask layer, the photo-resist layer, and the amorphous carbon layer; and
depositing a non-magnetic spacer layer over an exposed portion of the sacrificial cap layer, wherein the sacrificial cap layer is comprised of the same material as the non-magnetic spacer layer.

16. The method of claim 15, further comprising:
performing a first photo patterning process to define a pattern in the hard mask layer and the photo-resist layer to pattern the hard mask layer and the photo-resist layer;
selectively removing a portion of the hard mask layer and of the photo-resist layer according to the defined pattern;
removing the photo-resist layer; and
performing a second etching process to transfer a second pattern to the amorphous carbon layer, the sacrificial cap layer, and the top electrode.

17. The method of claim 16, further comprising:
removing the hard mask layer and the amorphous carbon layer; and
defining the second pattern on the MTJ structure using the sacrificial cap layer and the top electrode as a hard mask.

18. The method of claim 17, further comprising selectively removing a portion of the MTJ structure according to the second pattern.

19. The method of claim 18, further comprising:
after depositing the non-magnetic spacer layer, depositing an inter-layer dielectric layer over the non-magnetic spacer layer;
selectively removing a portion of the inter-layer dielectric layer to expose a portion of the non-magnetic spacer layer that is proximate to the sacrificial cap layer;
performing a Chemical Mechanical Planarization (CMP) process to remove a portion of the inter-layer dielectric layer, the non-magnetic spacer layer, and the sacrificial cap layer to define a substantially planar surface and to expose the top electrode at the substantially planar surface; and depositing a conductive layer over the top electrode.

20. The method of claim 9, wherein a thickness of the sacrificial cap layer is selected to have a photo resolution of approximately 10 angstroms.

21. The method of claim 9, wherein the sacrificial cap layer is configured to reduce corner rounding of the second electrode during at least one patterning process and to reduce exposure of a sidewall of the MTJ structure during the at least one patterning process.

* * * * *